United States Patent [19]

Harting et al.

[11] Patent Number: 4,955,819

[45] Date of Patent: Sep. 11, 1990

[54] PLUG CONNECTOR HAVING BENT CONTACT POSTS FOR INSERTION INTO PRINTED CIRCUIT BOARD HOLES

[75] Inventors: Dietmar Harting, Espelkamp; Hans Nagel, Porta Westfalica; Günter Pape, Bielefeld, all of Fed. Rep. of Germany

[73] Assignee: Harting Elektronik GmbH, Espelkamp, Fed. Rep. of Germany

[21] Appl. No.: 322,738

[22] Filed: Mar. 13, 1989

[30] Foreign Application Priority Data

Mar. 26, 1988 [DE] Fed. Rep. of Germany ....... 3810471

[51] Int. Cl.⁵ ............................................. H01R 23/68
[52] U.S. Cl. ......................................... 439/79; 29/764
[58] Field of Search ............................. 439/55, 59–62, 439/79, 80, 83, 629; 29/764

[56] References Cited

U.S. PATENT DOCUMENTS 3,864,000  2/1975  Coller et al. ...................... 439/246
4,080,041  3/1978  Hawkins ............................. 439/629
4,200,347  8/1980  Sinclair et al. ...................... 439/79
4,469,387  9/1984  McHugh ............................. 439/140
4,734,042  3/1988  Martens .............................. 439/62

FOREIGN PATENT DOCUMENTS 3318135  11/1984  Fed. Rep. of Germany.

OTHER PUBLICATIONS

DIN 41-62; "German Industrial Norm", part 1 (1–1988), part 2 (10–1987).

Primary Examiner—Neil Abrams
Attorney, Agent, or Firm—Jordan and Hamburg

[57] ABSTRACT

A plug connector with bent contact posts for insertion into printed circuit board holes includes a comb-shaped supplemental part having crosspieces with bearing shoulders for the contact posts disposed between the contact posts. The contact posts are mutually supported by way of the crosspieces so that a simple insertion tool, acting on the upper side of the upper row of posts, may be used for insertion of the plug connector.

11 Claims, 3 Drawing Sheets

PLUG CONNECTOR HAVING BENT CONTACT POSTS FOR INSERTION INTO PRINTED CIRCUIT BOARD HOLES

BACKGROUND OF THE INVENTION

This invention relates to a plug connector having bent contact posts for insertion into printed circuit board holes and which utilizes an insulating member containing contact elements which on one side is designed for the accommodation of a suitably designed matched plug and from the back connecting side of which project prolongations of the contact elements designed as pin-shaped contact posts which are bent at right angles to the direction of insertion of the matching plug, and where the contact posts are designed with an insertion section for contact fastening in printed circuit board holes.

When plug connectors of this type are inserted into printed circuit boards, it is necessary to apply a force of insertion on the upper side of the bends of the contact posts, specifically, insofar as possible, precisely in an axial direction of the contact post provided with the insertion section.

The insertion of such plug connectors is a problem especially when the plug connectors are provided with a plurality of parallel contact rows, such as, for example, in plug connectors according to DIN 41,612, where the bent contact posts of the various contact rows, viewed in the direction of insertion, are arranged above one another upon leaving the plug-connector insulating member.

A plug connector of the type mentioned at the beginning is disclosed in DE-OS 33 18 135. For the insertion of this plug connector there is provided an insertion tool, equipped with slots or pockets, which receive the bent contact posts and with the aid of which the operation of insertion is carried out. In this connection, however, two directions of motion, differing by 90°, are required for accommodation of the posts and for the actual operation of insertion, during insertion as well as in subsequent removal of the tool.

SUMMARY OF THE INVENTION

An object of the present invention is to design a plug connector of the type already mentioned in such a way that a simple as possible auxiliary tool can be used for inserting the contact posts of the plug connector into printed circuit board holes and where only a single direction of motion of the tool is required in the operation of insertion.

Accordingly to the present invention, this object is accomplished in that a supplemental comb-like part, formed of insulating material and provided with slots for the accommodation and lateral guidance of the connecting posts, is slipped between the contact posts from the printed circuit board connecting side, in that in the slots of the supplementary part there are provided crosspieces having bearing shoulders on which rest the regions of the contact posts projecting perpendicularly from the insulating member after insertion of the supplemental part, and in that the crosspieces are of such a height that their lower side rests on the upper side of the contact posts located under the crosspieces.

The advantages obtained by the invention consist particularly in that only one simple insertion tool need be used for insertion of the plug connector and, likewise, only a single direction of motion of the tool is required for doing this.

Another advantage is to be found in that the insulating member of the plug connector, in the same example as in the known examples according to DIN 41,612, may be designed for soldering into printed circuit boards so that, with regard to commercial production, sizable quantities may be manufactured and an inexpensive supplemental part makes it possible to provide such bent plug connectors for the insertion technique as well. Particularly when an additional supporting part is inserted into the supplemental part, deflection and buckling of the contact posts in the operation of insertion is prevented, so that even with improper manipulation such as, for example, uneven application of insertion force, reliable insertion of the contact posts is obtained.

DESCRIPTION OF THE PREFERRED EMBODIMENTS

Figure 1:
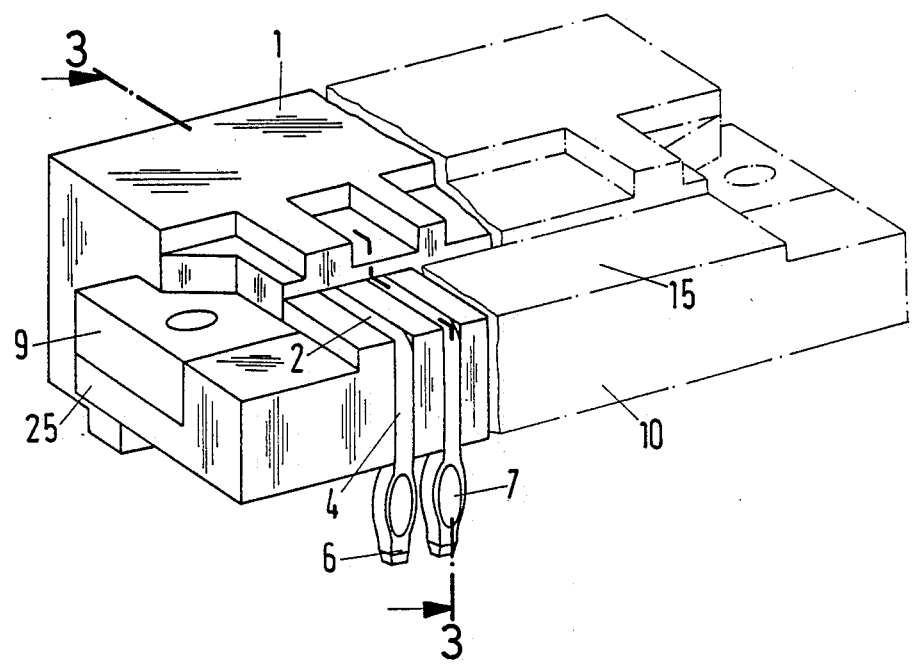
FIG. 1 is a perspective view of a plug connector according to one embodiment of the present invention.
Figure 2:
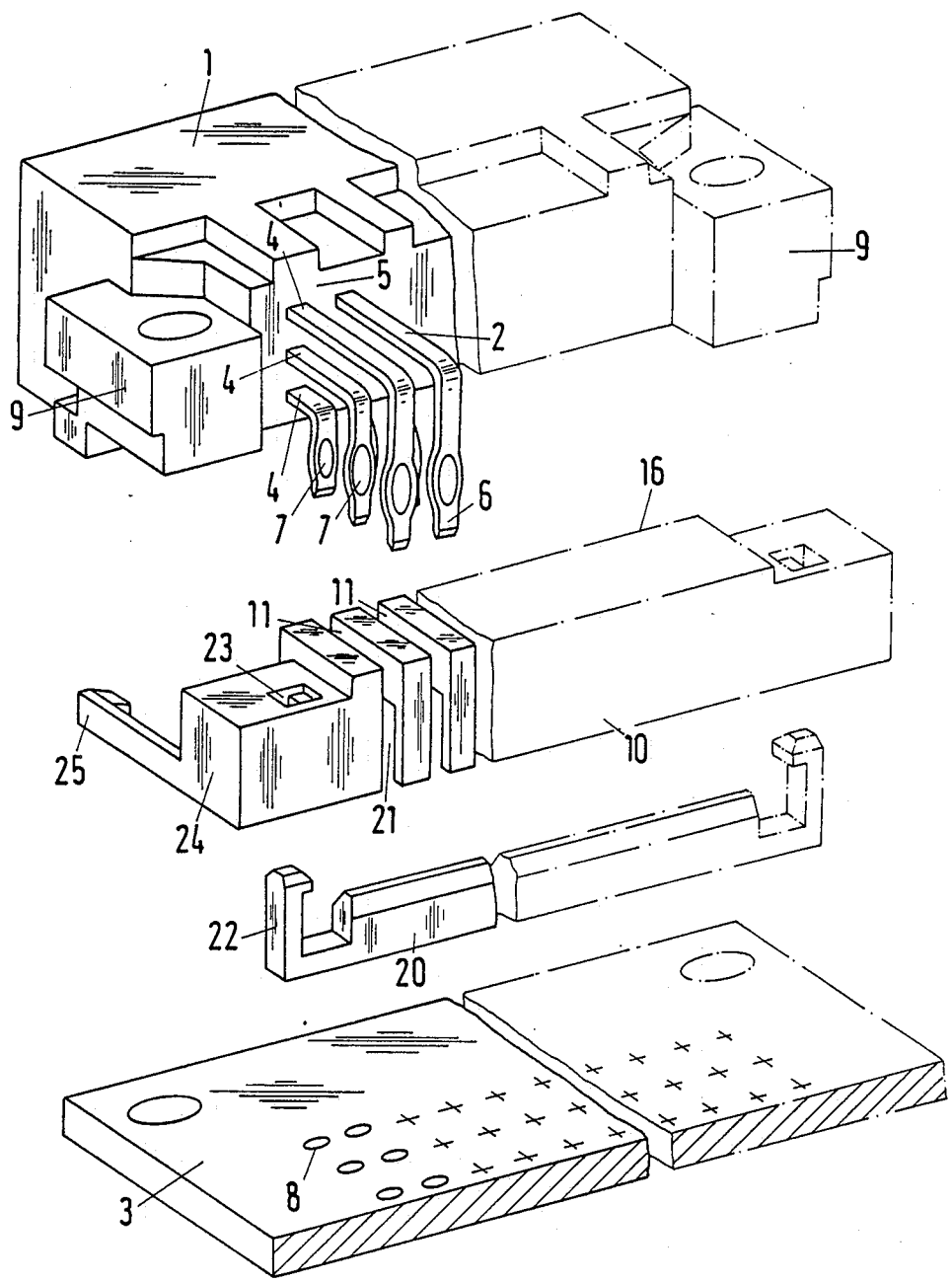
FIG. 2 is an exploded view of the plug connector of FIG. 1.

The plug connector shown in FIGS. 1 and 2 consists essentially of an insulating member 1, known per se, with contact elements 2 contained therein. The contact elements 2 are arranged in a plurality of parallel rows (for example, three rows in the illustrated embodiment), and their contact posts 4, provided for connection with a printed circuit board 3, project from the back connecting side 5 of the insulating member. The contact posts 2 are bent at right angles to the direction of insertion of the matching plug, i.e. perpendicular to the printed circuit board 3, and are provided at their ends 6 with an insertion section 7 for fastening and making contact in suitable printed circuit board holes 8. Lateral flanges 9 on the insulating member 1 having corresponding fastening holes are provided on the printed circuit board for additional fastening of the plug connector.

As shown in FIG. 2, the various rows of contact posts 4 are in each instance arranged directly under and/or above one another. To be able to press the contact posts with their insertion sections 7 into the holes of the printed circuit board, an insertion force must be exerted on the individual posts, specifically, on the upper side of the post regions running horizontally. In this connection, such force should be applied as accurately as possible concentric to the axis of the bent post ends, or at least as near close as possible concentric to this axis.

To this end there is provided a comb-like supplemental part 10, formed of insulating material, which is slipped between the contact posts 4 from the printed circuit board connecting side, i.e. the direction of the plug connector in which the bent posts with the insertion regions point. In the slots are formed crosspieces 13 forming bearing shoulders 12, the crosspieces 13 being sized with reference to their height and width so that they can just be slipped between each adjacent contact post 4 of the superjacent rows of posts.

Figure 3:
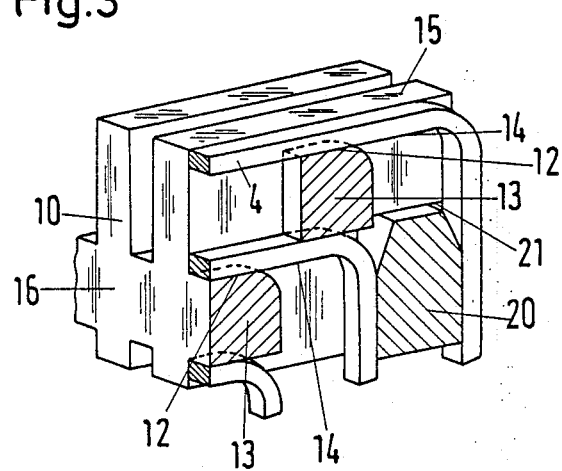
FIG. 3 is a sectional view of the plug connector taken along the line 3—3 in FIG. 1.

When the supplemental part 10 is introduced, it is first slipped between the contact posts 4 from below until the crosspieces 13 contact the lower surfaces 14 of the posts 4 projecting perpendicularly from the insulating member 1 and the upper side of the upper post row terminates flush with the upper side 15 of the supplemental part 10. The supplemental part 10 is then slipped in a direction displaced by 90° until its front side 16 rests on the back 5 of the insulating member 1, whereupon the back of the rear/outer post row terminates flush with the back side of the supplemental part 10. This position of the supplemental part and/ or the crosspieces with reference to the contact posts is shown in FIG. 3. As the drawings show, the crosspieces 13 are arranged form-lockingly between the horizontal regions of the contact posts 4 so that a force exerted on the upper side 15 of the supplemental part or the upper side of the upper post row is transmitted forcelockingly to all contact posts and, specifically, in a direct parallel to the axes of the vertical post regions.

For mounting of the supplemental part 10 on the insulating member 1 there are provided locking means 25 which engage in the region of the flanges 9 of the insulating member, as illustrated, for example, in FIG. 2.

Figure 4:
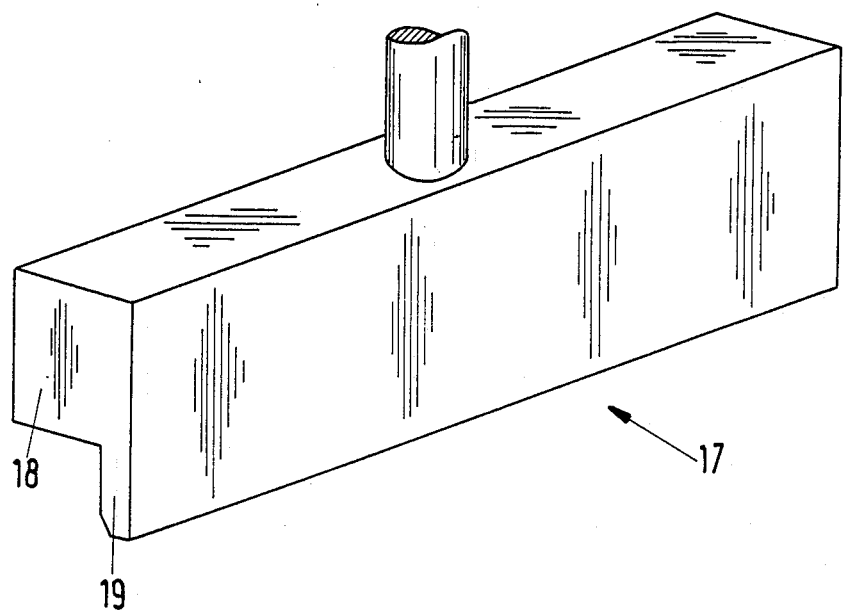
FIG. 4 is a perspective view of an insertion tool.

A plug connector provided with a supplemental part of this kind may be set up on a printed circuit board 3, the pin-shaped ends 6 of the posts extending into the circuit board holes 8, and the insertion sections 7 may be pressed into the holes with the aid of a simple insertion tool 17 (FIG. 4). In this connection, the insertion tool 17 is designed as a flat stamper 18 acting on the surface 15 of the supplemental part 10, but is preferably provided with a supporting plate 19 bent at a 90° angle. This supporting plate 19 prevents the outer post rows from deflecting or buckling outwardly in the operation of insertion.

To likewise counteract possible deflecting and buckling of the center post row in the operation of insertion, where it has been found that the greater the distance of the upper post region, running transversely, on which the force of insertion is exerted is from the insertion zone, the earlier deflection of the posts occurs, so that no buckling tendency is present in the inner short row, an additional bar-shaped support part 20 is provided. To this end, the supplemental part 10 is provided in the lower region, specifically between the outer and center post rows, with a recess 21, running transversely, into which the supporting part 20 may be inserted form-lockingly. In this connection, the width of the supporting part 20 corresponds exactly to the distance between these two rows. In addition, lateral locking hooks 22 on the supporting part 20 are capable of introduction and locking into suitably designed recesses 23 in the lateral parts 24 of the supplemental part 10. After introduction of the supporting part 20, the latter lies between the outer and center post rows, as shown in FIG. 3, so that when the plug connector is inserted, the center post row is supported and any possible deflection of the posts is effectively counteracted.

When the supporting part 20 is used, locking of the supplemental part 10 and insulating member 1 may be omitted, since after introduction of the supporting part 20, the entire arrangement is held together form-lockingly.

What we claim is:

1. A plug connector for connection to a printed circuit board comprising an insulating member, contact elements each having a first section extending from said insulating member in a first direction and each having a second section which is bent relative to said first section to extend in a second direction generally perpendicular to said first direction, a plurality of said first sections of said contact elements being spaced from one another in a direction perpendicular to said first direction, each of said second sections having contact posts adapted to be inserted in openings in a printed circuit board, an insulating supplemental part formed separately of said insulating member, mounting means on said supplemental part and on said insulating member for mounting said supplemental part on said insulating member in an assembled position, said supplemental part having spaced slots which receive said contact elements when said supplemental part is in said assembled position, said supplemental part having spaced crosspieces which extend across said slots and which support said first sections of each of said contact elements when said supplemental part is mounted in said assembled position on said insulating member, said crosspieces having a dimension in a direction perpendicular to said first direction corresponding to said space between said plurality of first sections of said contact elements to thereby provide support between said plurality of first sections of said contact elements to prevent deflection of said contact elements as said contact posts are inserted into said openings.

2. A plug connector according to claim 1, wherein said crosspieces have two opposed support surfaces generally parallel to one another and parallel to said first direction, one of said support surfaces being in contact with the first section of one of two juxtaposed contact elements, the other of said support surfaces being in contact with the first section of the other of said two juxtaposed contact elements.

3. A plug connector according to claim 2, wherein each of said first sections of said contact elements has an outer side and an opposite inner side, said one support surface being in contact with the inner side of said first section of said one contact element, said other support surface being in contact with the outer side of said first section of said other contact element.

4. A plug connector according to claim 13, wherein said mounting means is constructed to enable said supplemental part to be mounted in said assembled position by intially moving said supplemental part in said second direction as said crosspieces move between spaced second sections of said contact elements followed by moving said supplemental part in said first direction as said crosspieces move between spaced first sections of said contact elements.

5. A plug connector according to claim 13, wherein some of said second sections of said contact elements are spaced from one another by an extending space extending in a direction perpendicular to said second direction, said supplemental part having a channel located along said extending space, an insulating supporting part formed separately of said insulating member and separately of said supplemental part, and securement means on said supplemental part and on said supporting part for securing said supporting part on said supplemental part in an assembled position in which said supporting part is disposed in said channel such as to be located between two spaced second sections of two juxtaposed contact elements to thereby provide for support between said two spaced second sections of said two juxtaposed contact elements.

6. A plug connector according to claim 5, wherein said supporting part has opposed supporting faces contacting said two spaced second sections of said two juxtaposed contact elements.

7. A plug connector according to claim 1, wherein said supplemental part has an outer surface, said slots having slot portions in said outer surface, said plurality of contact elements comprising an outer row of contact elements with the first section of each contact element in said outer row being disposed in said slot portion and having an outer surface generally flush with said outer surface of said supplemental part.

8. A plug connector according to claim 1, wherein said supplemental part has an outer surface, said slots having slot portions in said outer surface, said plurality of contact elements comprising an outer row of contact elements with the second section of each contact element in said outer row being disposed in said slot portions and having an outer surface generally flush with said outer surface of said supplemental part.

9. A plug connector according to claim 1, wherein at least one of said slots receives a plurality of said contact elements, said plurality of contact elements constituting a row of contact elements, each of the first sections of said contact elements of said row constituting said plurality of first sections of said contact elements which are spaced from one another by said space extending in a direction perpendicular to said first direction, each of said first sections of said row of contact elements being disposed in aligned array in said one slot, each of said second sections of said row of contact elements being disposed in aligned array in said one slot.

10. A plug connector according to claim 9, wherein there are a plurality of said rows of said contact elements each disposed in a plurality of respective slots in said supplemental part.

11. A plug connector according to claim 9, wherein said supplemental part has a plurality of said crosspieces in said one slot.

* * * * *